United States Patent
Garrett et al.

(10) Patent No.: US 7,647,547 B2
(45) Date of Patent: Jan. 12, 2010

(54) TURBO DECODER WITH REDUCED-SIZE BRANCH METRIC CACHE

(75) Inventors: David Garrett, San Jose, CA (US); Bing Xu, Gilbert, AZ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 423 days.

(21) Appl. No.: 10/480,136

(22) PCT Filed: Aug. 2, 2002

(86) PCT No.: PCT/US02/24537

§ 371 (c)(1),
(2), (4) Date: Dec. 9, 2003

(87) PCT Pub. No.: WO03/015290

PCT Pub. Date: Feb. 20, 2003

(65) Prior Publication Data

US 2004/0181742 A1    Sep. 16, 2004

(30) Foreign Application Priority Data

Aug. 3, 2001    (AU) .................................... PR 6793

(51) Int. Cl.
*H03M 13/03*    (2006.01)

(52) U.S. Cl. ........................ 714/796; 714/794; 714/795

(58) Field of Classification Search .......... 714/794–796
See application file for complete search history.

(56) References Cited

U.S. PATENT DOCUMENTS

| | | | | |
|---|---|---|---|---|
| 4,932,029 A | * | 6/1990 | Heichler ..................... | 714/796 |
| 5,220,570 A | * | 6/1993 | Lou et al. ................... | 714/791 |
| 5,295,142 A | * | 3/1994 | Hatakeyama ............... | 714/794 |
| 5,432,803 A | * | 7/1995 | Liu et al. .................... | 714/794 |
| 5,448,583 A | * | 9/1995 | Miyamoto et al. .......... | 714/795 |
| 5,970,104 A | * | 10/1999 | Zhong et al. ................ | 375/341 |

(Continued)

FOREIGN PATENT DOCUMENTS

EP    1120916 A1 *    8/2001

OTHER PUBLICATIONS

Sanjin Hong et aL, "VLSI Design and Implementation of Low-Complexity Adaptive Turbo-Code Encoder and Decoder for Wireless Mobile Communication Applications," 1998 *IEEE Workshop* on Signal Processing Systems, SIPS 98, Oct. 9, 1998, pp. 233-242.

(Continued)

*Primary Examiner*—Joseph D Torres
(74) *Attorney, Agent, or Firm*—Williams, Morgan & Amerson

(57) ABSTRACT

A method and an apparatus is provided for producing branch metrics in a LogMAP turbo decoding operation. During a forward recursion of a trellis, a set of primary branch metrics is generated. The primary branch metrics are stored in receiver form in a relatively small memory cache module and corresponding secondary branch metrics are produced by negating the primary branch metrics. The primary branch metrics and the secondary branch metrics constitute all possible branch metrics for a given state in the trellis. During a backwards recursion of the trellis, the stored primary branch metrics are retrieved from the memory cache module and the secondary branch metrics are regenerated by negating the retrieved primary branch metrics.

8 Claims, 4 Drawing Sheets

U.S. PATENT DOCUMENTS

| | | | |
|---|---|---|---|
| 6,028,899 A * | 2/2000 | Petersen | 375/341 |
| 6,259,749 B1 * | 7/2001 | Andoh | 375/341 |
| 6,272,661 B1 * | 8/2001 | Yamaguchi | 714/795 |
| 6,304,996 B1 * | 10/2001 | Van Stralen et al. | 714/796 |
| 6,477,679 B1 * | 11/2002 | Such et al. | 714/755 |
| 6,477,681 B1 * | 11/2002 | Taipale et al. | 714/795 |
| 6,484,283 B2 * | 11/2002 | Stephen et al. | 714/786 |

OTHER PUBLICATIONS

EP-A-0 660 534 (At&T CORP) Jun. 28, 1995.

* cited by examiner

TURBO DECODER WITH REDUCED-SIZE BRANCH METRIC CACHE

CROSS-REFERENCE TO RELATED APPLICATION

This application claims priority of Australian Provisional Application No. PR6793, which filed on Aug. 3, 2001.

BACKGROUND OF THE INVENTION

I. Field of the Invention

The present invention relates generally to decoding in communication systems and, in particular, to the calculation of branch metrics in logMAP turbo decoding in wireless communication systems.

II. Description of the Related Art

Turbo decoding utilizes interactive decoding and random interleaving to achieve an error performance close to the Shannon limit Consequently, turbo decoding is often employed in decoding for third generation (3G) wireless communications systems.

A trellis diagram represents the possible state changes of a convolutional encoder over time. Each state in the trellis is connected, via two associated branch metrics, to two separate states in the trellis in the next time period. When decoding received symbols, decoding algorithms typically traverse the trellis in a forward direction to determine the probabilities of the individual states and the associated branch metrics.

The logMAP algorithm differs from other decoding algorithms, such as the Viterbi algorithm, by performing both a forward and a backward recursion over a trellis. The algorithm can be partitioned to provide a Windowed LogMAP arrangement where the blocks are divided into smaller alpha and beta recursions. Alpha values, representing the probabilities of each state in the trellis, are determined in the forward recursion. Beta values, representing the probabilities of each state in the reverse direction, are determined during the backwards recursion.

The respective probabilities of each pair of branch metrics associated with any given state are the gamma values ($\gamma$). The gamma values are calculated during each of the forward and backwards recursions of the trellis. The logMAP branch metrics are calculated using the following equation:

$$\gamma_k^i = d^i(y_s + Le) + y_p c^{i,k} \quad (1)$$

where i represents the path (0 or 1), d and c are the expected data and parity bits, respectively, and $y_s$, $y_p$ and $L_e$ represent the soft information for data, parity and extrinsic information, respectively, and k represents the current state in the trellis for which branch metrics are being calculated.

For any given rate ½ trellis code, each of the expected data and parity bits, d and c respectively, may take the values of +1 or −1. Consequently, there are four possible branch metric combinations for the given input variables:

($y_s + L_e + y_p$) for d=+1, c=+1;
($y_s + L_e + y_p$) for d=+1, c=−1;
($-y_s - L_e - y_p$) for d=−1, c=−1;
($-y_s - L_e + y_p$) for d=−1, c=+1.

When traversing the trellis in the forward recursion stage, both the input symbol and the extrinsic memory must be accessed to compute the gamma values. FIG. 1 shows a prior art arrangement 100 for calculating branch metrics for a rate ½ decoder. Data ($y_s$) 130 and parity ($y_p$) 140 are read from a first memory 120. The time and power required for read accesses from the first memory 120 are proportional to the size of the first memory 120. The first memory 120 must be sufficiently large to store data and parity information for the entire length of the block being decoded. The first memory 120 is typically of the order of ~5 k words in size for mobile communications applications.

It is possible to store the data 130 and parity 140 in two distinct memory units, rather than the single first memory 120. However, there does not appear to be any apparent advantage associated with such an implementation, as reading the required data 130 and parity 140 from separate memory units would require two memory address decodes in addition to the retrieval of the information. Such an implementation is not appreciably faster than a single memory unit implementation and requires more power.

A processor 150 receives the data 130 and parity 140, along with extrinsic information ($L_e$) 115 that is read from a second memory 110, to produce output branch metrics 155 corresponding to all paths in the trellis. The output branch metric 155 is presented to a trellis calculation module 160 that utilizes the output branch metric 155 to traverse the trellis.

When the backward recursion of the trellis commences to calculate the beta values, each of the four possible combinations for the branch metric computation must be regenerated. This requires a read access to the memory 120 storing data and parity information, and one read access to the second memory 110 storing extrinsic information, in addition to the cost of computation in the processor 150. As noted above, the time and power consumption of each memory access is directly proportional to the number of memory cells and, consequently, each read access to either one of the first memory 120 and the second memory 110 is costly with respect to power consumption. Therefore, reducing the number of read accesses to either one or both of the first memory 120 and the second memory 110 would be advantageous.

FIG. 2 shows a prior art arrangement 200 for calculating branch metrics for a rate ⅓ LogMAP decoder. The branch metric combinations are given by Equation 2 below, in which $y_{p1}$ represents a first parity bit, $y_{p2}$ represents a second parity bit, $c_1$ represents the expected first parity bit and $c_2$ represents the expected second parity bit $$\gamma_k^i = d^i(y_s + Le) + y_{p1} c_1^{i,k} + y_{p2} c_2^{i,k} \quad (2)$$

As each of d, $c_1$ and $c_2$ can be either +1 or −1, there are eight possible branch metric combinations for a rate ⅓ decoder.

A first memory 220 stores each of data ($y_s$) 230, first parity ($y_{p1}$) 240 and second parity ($y_{p2}$) 245. Each of the data ($y_s$) 230, first parity ($y_{p1}$) 240 and second parity ($y_{p2}$) 245 is read from the first memory 220 and presented to a processor 250. The processor 250 also receives extrinsic information ($L_e$) 215 that is read from a second memory 210. The processor 250 calculates all the branch metrics 255, and presents the branch metrics 255 to a trellis calculation module 260.

Branch metrics calculated during the forward recursion of a decoding trellis are often stored in memory units so that the branch metrics can be reused during a backwards recursion of the decoding trellis. As all of the branch metrics calculated during the forward recursion are stored, the memory units utilized are necessarily large. As noted above, read accesses to such memory units are costly in respect of power consumption and time.

In UMTS and CDMA 2000 systems, approximately 40% of computation in baseband processing is in the turbo decoding process alone. A single component can dominate the power consumption of a low-power handset, or a large infrastructure product. Any amount of power savings translates into a substantial advantage in the handset market, where battery life is paramount, or in packaging for wireless infrastructure products, where heat dissipation is important.

SUMMARY OF THE INVENTION

The present invention provides a method for generating at least two branch metrics. The method generates the branch metrics, each having an inverse polarity to the other.

In one embodiment of the present invention, at least one primary branch metric and at least one secondary branch metric are generated. The secondary branch metric is generated by negating the primary branch metric.

In one example of the present invention, a method provides for producing branch metrics in a LogMAP turbo decoding operation. The method comprises generating a branch metric for each primary combination of extrinsic, parity and information data, and storing the primary branch metrics to generate by negation the remaining secondary ones of the branch metrics, during a forward recursion of a trellis. During a backwards recursion of the trellis, the method comprises retrieving the stored primary branch metrics, and generating the secondary branch metrics by negating the retrieved primary branch metrics.

Other aspects of the present invention are also disclosed.

BRIEF DESCRIPTION OF THE DRAWINGS

The present invention will be better understood from reading the following description of non-limiting embodiments, with reference to the attached drawings, wherein below.

Figure 1:
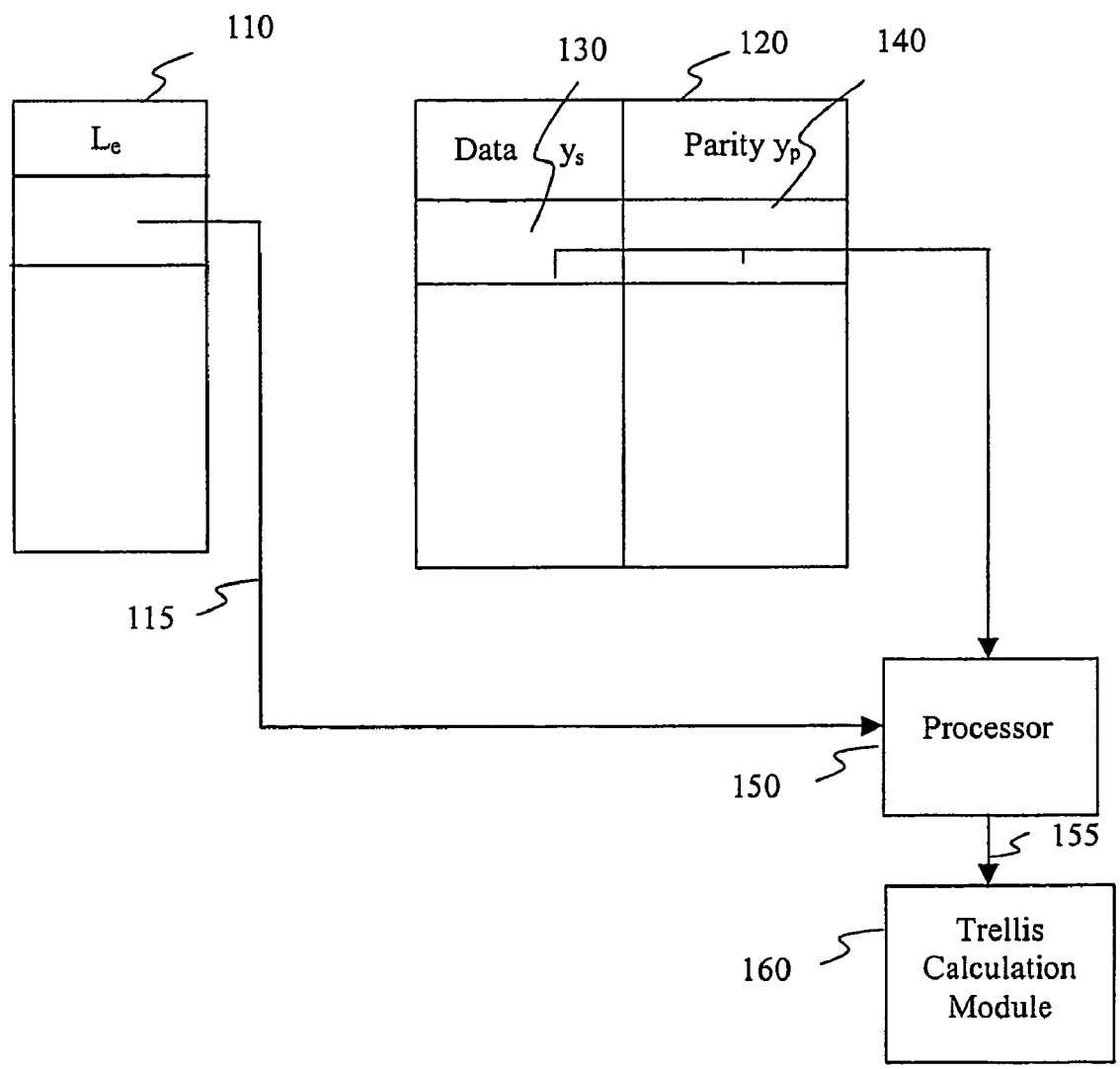
FIG. 1 is a block diagram representation of a known arrangement for calculating branch metrics for a rate ½ decoder.
Figure 2:
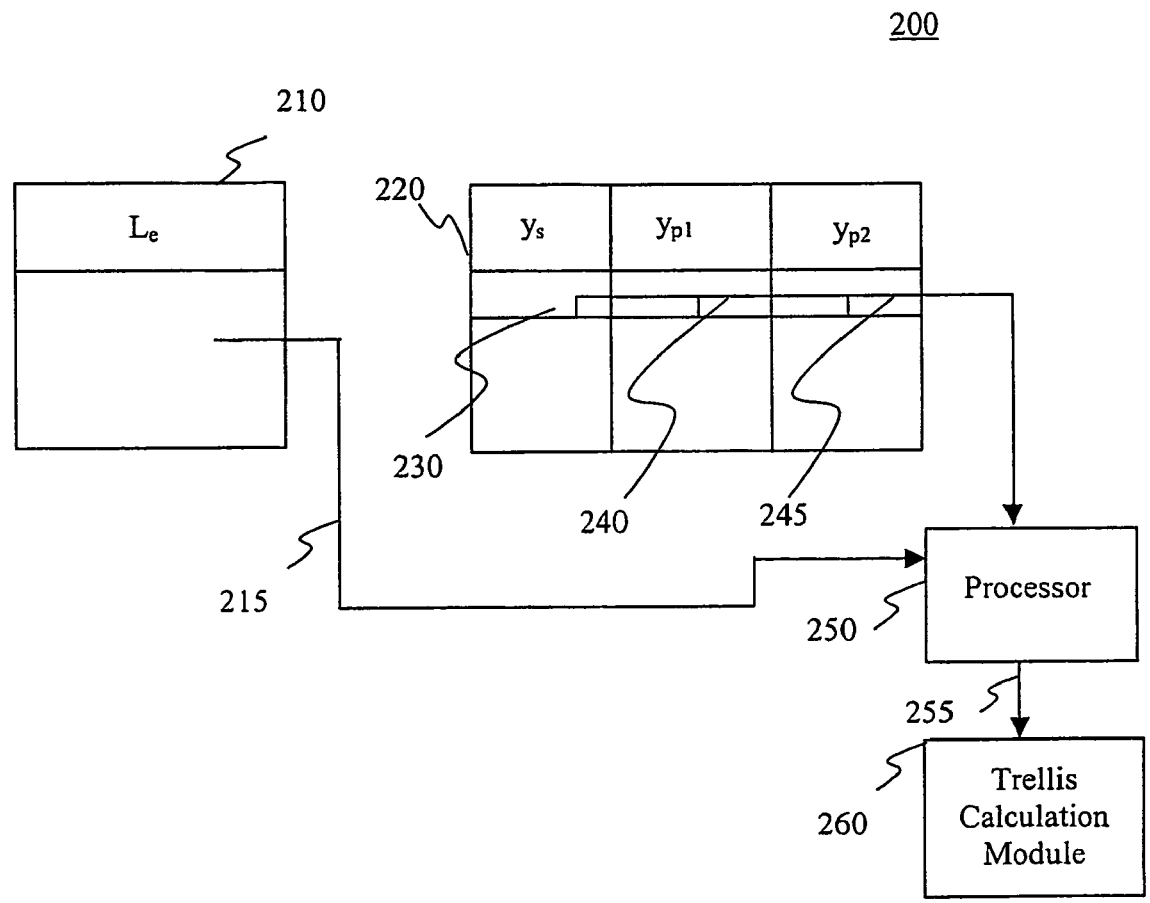
FIG. 2 is a block diagram representation of a known arrangement for calculating branch metrics for a rate ⅓ decoder.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

Where reference is made in any one or more of the accompanying drawings to steps and/or features, which have the same reference numerals, those steps and/or features have for the purposes of this description the same function(s) or operation(s), unless the contrary intention appears.

Figure 3:
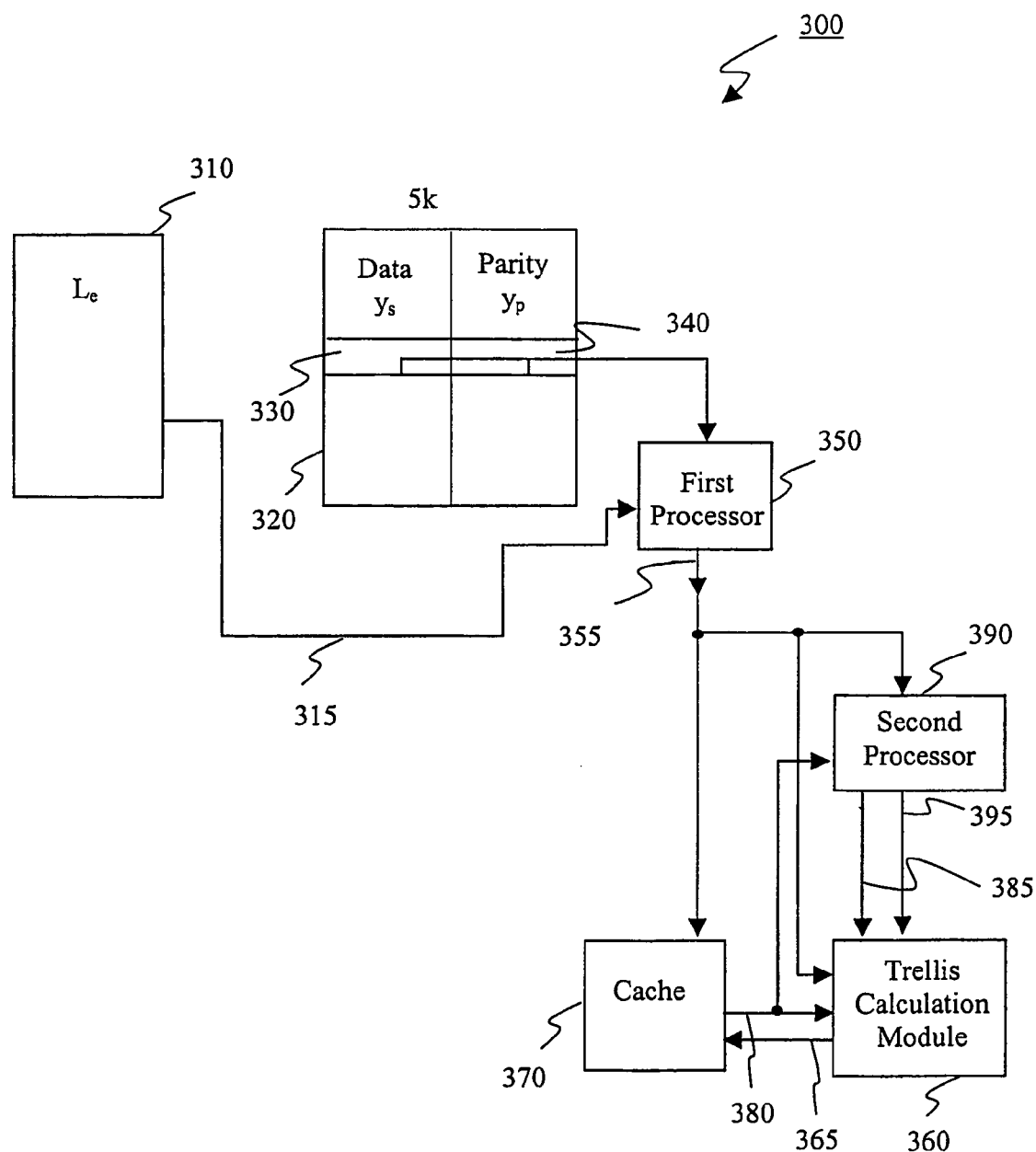
FIG. 3 is a schematic block diagram representation of an arrangement for a rate ½ logMAP turbo decoder that utilizes a branch metric cache.

FIG. 3 shows an arrangement 300 for rate ½ LogMAP turbo decoding that utilizes a branch metric cache 370. During a forward recursion of a coding trellis, a read access from a first memory 320 is required to access data ($y_s$) 330 and parity ($y_p$) 340, each typically described by 8 bits of information. Extrinsic information 315 is read from a second memory 310. The memories 310 and 320 typically have a capacity of 5 kilobytes for mobile implementations. Each of the retrieved data 330, parity 340 and extrinsic information 315 is presented to a first processor 350. The first processor 350 calculates from the retrieved parity, extrinsic and information data, a predetermined half of the relevant combinations of the data, thus providing a set of primary branch metrics 355. The set 355 is stored in the cache memory 370 and is also provided to each of a trellis calculation module 360 and a second processor 390. The second processor 390 negates the set of primary branch metrics 355 to produce a set of secondary branch metrics 395, which are provided to the trellis calculation module 360.

Due to the symmetry of a trellis structure, for a rate ½ trellis decoder two of the four possible branch metric combinations may be generated from the other two possible combinations. Thus, $(y_s+L_e+y_p)$ and $(y_s+L_e-y_p)$ can be negated to produce $(-y_s-L_e-y_p)$ and $(-y_s-L_e+y_p)$, respectively. The branch metric combinations that are calculated are the primary branch metrics. The corresponding branch metric combinations that are derived by negating the primary branch metric combinations are the secondary branch metric combinations. Due to the storage of the set of primary branch metrics in the cache memory 370, it is only necessary to access data and parity and the corresponding extrinsic information from the two memory units 310 and 320, during the forward recursion of a trellis. The remaining two branch metrics are calculated by negating the first two calculated branch metrics. The negation is relatively inexpensive, both in terms of processing time and power consumption and is performed by the second processor 390. All possible branch metric combinations are presented to the trellis calculation module 360 in the forward recursion to determine the alpha values.

As two of the branch metrics may be generated by negating the first two branch metrics, only the first two calculated branch metrics are stored in the branch metric cache 370. Accordingly, the size of the branch metric cache need only be sufficiently large to store half of the possible set of branch metrics and thus the cache may be referred to as a reduced set branch metric cache.

When the backward recursion of the trellis commences to calculate required beta values, the trellis processor 360 sends a control signal 365 to retrieve from the reduced set branch metric cache 370 the primary branch metrics 355 that were stored during the forward trellis recursion, thus obviating memory accesses to each of the first memory 320 and the second memory 310. Due to the relatively small size of the reduced set branch metric cache 370, typically about the window size, any read access to retrieve required primary branch metrics from the reduced set branch metric cache 370 requires significantly less time and power than a comparable read access from either one of the first memory 320 and the second memory 310. Furthermore, retrieving primary branch metrics 355 directly from the reduced set branch metric cache 370 allows the backward recursion of the trellis to omit calculations undertaken during the forward trellis traversal by the processor 350. Thus, utilizing a reduced set branch metric cache 370 that is relatively small provides desirable time and power savings over prior art arrangements. The retrieved primary branch metrics 380 are presented to each of the trellis calculation module 360 and the second processor 390. Negation of the retrieved primary branch metrics 380 is again performed by the second processor 390 to produce secondary branch metrics 385 to complete the set of branch metrics necessary for trellis calculation.

As the reduced set branch metric cache 370 is only required to store half of the possible branch metric combinations generated during the forward recursion of a decoding trellis, the reduced set branch metric cache 370 may be implemented using a small, dedicated memory unit. The power consumption associated with a read access to any memory unit is dependent on the size of the memory unit being accessed. As the reduced set branch metric cache 370 is significantly smaller than memory units required to store all branch metric combinations calculated during a forward recursion of a decoding trellis, read accesses to the reduced set branch metric cache 370 are quicker and consume less power.

Figure 4:
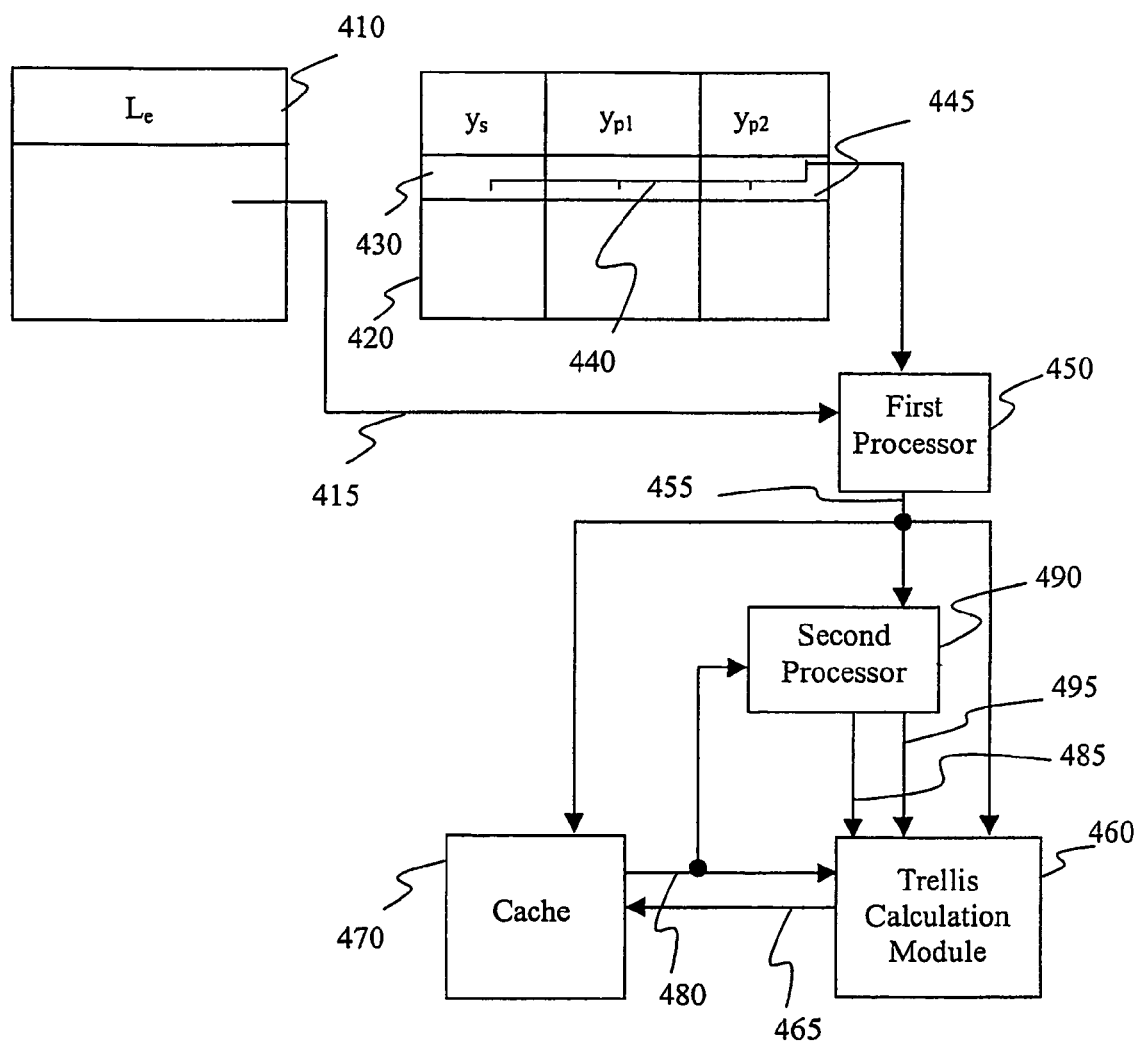
FIG. 4 is a schematic block diagram representation of an arrangement for a rate ⅕ logMAP turbo decoder that utilizes a branch metric cache.

FIG. 4 shows an arrangement 400 for logMAP decoding for a rate ⅓ decoder. During a forward recursion of a coding trellis, data ($y_s$) 430, first parity ($y_{p1}$) 440 and second parity ($y_{p2}$) 445 are obtained via read accesses from a first memory 420. Extrinsic information ($L_e$) 415 is obtained via a read access from a second memory 410. Each of the data ($y_s$) 430, first parity ($y_{p1}$) 440, second parity ($y_{p2}$) 445 and extrinsic information ($L_e$) 415 are presented to a first processor 450. The first processor 450 produces four branch metric possibilities 455 from the input parameters and presents the branch metrics 455 to each of a reduced set branch metric cache 470, a second processor 490 and a trellis calculation module 460. Each of the branch metrics 455 is stored in the reduced set branch metric cache 470. The remaining four possible combinations are then generated by the second processor 490 by negating the initial four branch metric combinations 455 to produce a secondary set of branch metrics 495, which are presented to the trellis calculation module 460.

During a backwards recursion of a trellis, the trellis calculation module 460 retrieves branch metrics 455 from the reduced set branch metric cache 470 without the need to recalculate the branch metrics, thus realizing significant power and time savings. The trellis calculation module sends a control signal 465 to the reduced set branch metric cache 470. The branch metrics 455 that were stored during the forward recursion of the trellis are accessed and presented as retrieved branch metrics 480 to each of the trellis calculation module 460 and the second processor 490. The second processor 490 negates the retrieved branch metrics 480 to generate secondary branch metrics 485 that are presented to the trellis calculation module 460 to complete the set of branch metrics necessary for trellis calculation.

Whilst a branch metric cache for a rate ⅓ decoding application is required to store more information than a branch metric cache for a rate ½ decoding application, and therefore must be larger in size, the memory units utilized in the rate ⅓ decoding application must be correspondingly larger than the memory units utilized in the rate ½ decoding. Consequently, the principle of utilizing a relatively small, dedicated branch metric cache may be extended to any combination of decoding rates.

The principles of the methods and arrangements described herein have general applicability to trellis decoding in telecommunications systems.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system and portions thereof and of the described method and system may be implemented in different locations, such as a wireless unit, a base station, a base station controller, a mobile switching center and/or a radar system. Moreover, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention. It is therefore contemplated that the appended claims will cover any such modifications or embodiments as fall within the true scope of the invention.

We claim:

1. A method for decoding using branch metrics generated using a decoding trellis, the method comprising:

generating, during a forward recursion of the decoding trellis, a first subset of a plurality of forward branch metrics of the decoding trellis from a primary combination of extrinsic, parity and information data associated with at least one symbol, the first subset having a property that a second subset of the plurality of forward branch metrics can be determined based on a symmetry of the plurality of forward branch metrics;

storing the first subset of the plurality of forward branch metrics and discarding the second subset of the plurality of forward branch metrics;

upon commencing a reverse recursion of the decoding trellis, retrieving the stored first subset and determining the second subset using the symmetry of the plurality of forward branch metrics, the first and second subsets being applied in the further decoding operation;

generating, during the reverse recursion of the decoding trellis, a plurality of reverse branch metrics using the plurality of forward branch metrics; and decoding said at least one symbol using the forward and reverse branch metrics.

2. The method of claim 1, wherein at least one of the branch metrics in the second subset is the negation of a corresponding one of the stored branch metrics.

3. The method of claim 2, wherein the step of generating the second subset comprises:

negating the retrieved first subset of branch metrics.

4. The method of claim 3, wherein the forward recursion and the backwards recursion are part of a trellis algorithm.

5. The method of claim 1, wherein generating the first subset of the plurality of branch metrics of the decoding trellis comprises retrieving the extrinsic data from a first memory having a first size and retrieving the parity and information data from at least one second memory having a second size.

6. The method of claim 5, wherein the first size and the second size are sufficiently large to store data and parity information for each block that is being decoded.

7. The method of claim 6, wherein storing the first subset of the plurality of primary branch metrics comprises storing the first subset of the plurality of primary branch metrics in a cache memory having a third size that is smaller than either the first size or the second size.

8. The method of claim 7, wherein the third size is approximately equal to a window size associated with the decoding trellis.

* * * * *

UNITED STATES PATENT AND TRADEMARK OFFICE
CERTIFICATE OF CORRECTION

| | | |
|---|---|---|
| PATENT NO. | : 7,647,547 B2 | Page 1 of 1 |
| APPLICATION NO. | : 10/480136 | |
| DATED | : January 12, 2010 | |
| INVENTOR(S) | : Garrett et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 694 days.

Signed and Sealed this

Eighteenth Day of January, 2011

David J. Kappos
*Director of the United States Patent and Trademark Office*